United States Patent
Kostamovaara et al.

(10) Patent No.: US 8,934,514 B2
(45) Date of Patent: Jan. 13, 2015

(54) LASER

(71) Applicants: Oulun yliopisto, Oulu (FI); University of York, York (GB)

(72) Inventors: Juha Kostamovaara, Oulu (FI); Eugene A. Avrutin, York (GB); Boris Ryvkin, St. Petersburg (RU)

(73) Assignees: Oulun yliopisto, Oulu (FI); University of York, York (GB)

( * ) Notice: Subject to any disclaimer, the term of this patent is extended or adjusted under 35 U.S.C. 154(b) by 0 days.

(21) Appl. No.: 14/104,689

(22) Filed: Dec. 12, 2013

(65) Prior Publication Data

US 2014/0169397 A1    Jun. 19, 2014

Related U.S. Application Data

(60) Provisional application No. 61/736,890, filed on Dec. 13, 2012.

(51) Int. Cl.
*H01S 5/00* (2006.01)
*H01S 5/183* (2006.01)

(52) U.S. Cl.
CPC .................................. *H01S 5/18361* (2013.01)
USPC ................. 372/50.124; 372/50.11; 372/44.01; 372/43.01; 372/45.012

(58) Field of Classification Search
CPC ........... H01S 5/187; H01S 5/183; H01S 5/18; H01S 5/125; H01S 5/12
USPC .................. 372/50.124, 50.11, 45.012, 44.01, 372/43.01
See application file for complete search history.

(56) References Cited

U.S. PATENT DOCUMENTS

| 4,435,808 | A | * | 3/1984 | Javan | 372/11 |
| 6,483,858 | B1 | * | 11/2002 | Hovater et al. | 372/18 |
| 2007/0274361 | A1 | * | 11/2007 | Calvez et al. | 372/50.1 |

OTHER PUBLICATIONS

Ryvkin, B. S., et al., "Vertical Cavity Surface Emitting Lasers with the Active Layer Position Detuned from Standing Wave Antinode for Picosecond Pulse Generation by Gain Switching," *Journal of Applied Physics 110*, 123101 (2011).

* cited by examiner

*Primary Examiner* — Kinam Park
(74) *Attorney, Agent, or Firm* — Hamilton, Brook, Smith & Reynolds, P.C.

(57) ABSTRACT

A vertical cavity surface emitting laser (VCSEL) configured to operate in a gain switching regime includes a cavity that is terminated by reflectors at both ends for enabling a standing wave of optical radiation therebetween. The cavity comprises at least one quantum well, each of the quantum wells located at a position where a value of a standing wave factor for each quantum well is between zero and one, $0<\xi<1$.

3 Claims, 3 Drawing Sheets

LASER

RELATED APPLICATION

This application claims the benefit of U.S. Provisional Application No. 61/736,890, filed on Dec. 13, 2012. The entire teachings of the above application are incorporated herein by reference.

TECHNICAL FIELD

The invention relates to a laser and particularly a gain switched vertical cavity surface emitting laser (VCSEL).

BACKGROUND

There is a need for temporally short laser pulses in various applications including vehicle safety devices, 3D imaging, laser tomography, time imaging, and spectroscopy. For a number of applications, particularly in biotechnology and biological measurements, the required pulse energy is in the order of at least a few nanojoules, whereas the optimal pulse duration is of the order of a few tens to hundreds of picoseconds.

It is also desirable from the practical point of view that the optical pulse is generated efficiently, with an injection current pulse of a modest amplitude and more than a nanosecond long, and thus relatively straightforwardly available from commercial silicon electronics.

From the perspective of optical collimation, it is desirable to minimize the emitting surface, or maximize the brightness or intensity of the laser light which have been resolved by gain-switching of an edge-emitting semiconductor laser with an extremely large ratio of the active layer width da to the optical confinement factor Γa. A limitation inherent in edge emitters, however, is a low beam quality. Besides, in a number of applications, a narrow spectral linewidth is significant, in which case the massively longitudinally multimode nature of edge emitting laser light is a disadvantage. Hence, there is a need for a better laser.

SUMMARY

According to an aspect of the present invention, there is provided a vertical cavity surface emitting laser configured to operate in a gain switching regime. The cavity is terminated by reflectors at both ends for enabling a standing wave of optical radiation therebetween. The cavity comprises at least one quantum well, each of which is located at a position where a value of a standing wave factor $\xi$ for each quantum well is between zero and one, $0<\xi<1$.

According to another aspect of the present invention, there is provided a pulse vertical cavity surface emitting laser (VCSEL) operating in the gain switching regime, the VCSEL comprising a cavity terminated by top and bottom distributed Bragg reflectors, and active layers inside the cavity consisting of some quantum wells (QWs) whose positions in the cavity are detuned from the standing wave antinodes in such a way that the standing wave factor for each quantum well is between zero and one, $0<\xi<1$.

The invention provides excellent beam quality with narrowband lasing, for example.

BRIEF DESCRIPTION OF THE DRAWINGS

Embodiments of the present invention are described below, by way of example only, with reference to the accompanying drawings.

DETAILED DESCRIPTION

It is worthwhile to suggest applying the approach of high energy picosecond pulse generation by increasing the da/Fa ratio to gain switching vertical cavity surface emitting lasers (VCSELs), which can combine excellent beam quality with narrowband lasing because gain switched single-frequency lasers are important in certain fields.

Figure 1:
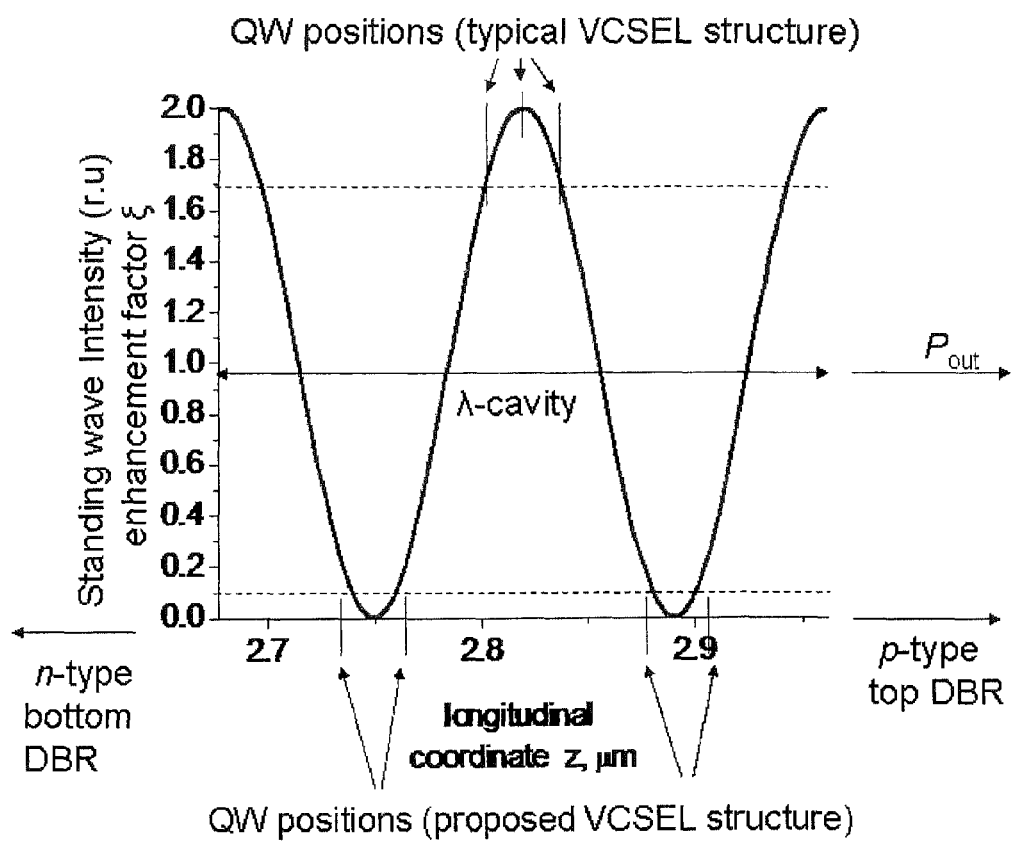
FIG. 1 illustrates an example of the field intensity distribution in a VCSEL $\lambda$-cavity, showing the QW positions in the standard laser cavity (top) and the proposed cavity (bottom)

FIG. 1 shows an example of a field intensity distribution in a VCSEL $\lambda$-cavity, with the QW positions in the standard prior art laser cavity (top) and the proposed cavity (bottom). To demonstrate the potential of the approach proposed, consider a typical gain switched AlGaAs/InGaAs VCSEL (Aluminum Gallium Arsenic/Indium Gallium Arsenic Vertical Cavity Surface Emitting Laser) intended for operating at a wavelength $\lambda$ of $\lambda=0.98$ µm, with a $\lambda$-cavity (as illustrated schematically in FIG. 1) terminated by AlGaAs/GaAs top and bottom DBRs (Distributed Bragg reflectors). Additionally or alternatively, at least one reflector may be of some other type of mirror. In a prior art "traditional" laser design, the active layer consists of three InGaAs quantum wells (QWs) located in small region associated with an antinode of the standing wave intensity profile in the middle of the cavity. Light is output to the direction shown by a straight line Pout in FIG. 1.

In an embodiment, the cavity comprises at least one quantum well. Each quantum well is at a position where a value of a standing wave factor for each quantum well is between zero and one, $0<\xi<1$. The at least one quantum well provides the cavity with the optical radiation when electrical power is fed to the laser.

Standing wave (enhancement) factor $\xi$ shown in FIG. 1 takes into account the location of the QWs in relation to the nodes (node is point of minimum intensity) of the cavity standing wave. The standing wave factor $\xi$ may be expressed as $\xi \approx (1+\cos 2\beta_1 z) = 2(\cos \beta_1 z)^2$, where $\beta_1$ is a longitudinal propagation constant ($\beta=2\pi n_{\mathit{eff}}/\lambda$, $n_{\mathit{eff}}$ is an effective index of the guided mode).

In an embodiment of a proposed modification of the structure, the active region may include four QWs, located in pairs near (though not precisely at) the two nodes of the standing wave in the $\lambda$-cavity.

VCSEL dynamics may be analyzed using the standard rate equations for the carrier density N and the photon density S, for example. The equations describe the VCSEL dynamics well so long as the in-plain non-uniformities of current and carrier densities are not significant, and the laser is single-mode; we may write the equations in the form:

$$\frac{dN}{dt} = \frac{i(t)}{eV} - \frac{N}{\tau_n(N)} - v_g g(N,S) S \qquad (1)$$

-continued $$\frac{dS}{dt} = \left(\Gamma_a v_g g(N, S) - \frac{1}{\tau_p}\right)S + \frac{\Gamma_a \beta N}{\tau_n(N)} \quad (2)$$

where, as usual, V is the active area volume, $\tau_n$ (N) is the carrier recombination time, a simple two-parameter logarithmic approximation can be used for the material gain g=g(N, S), and β is the spontaneous emission factor. The confinement factor in a VCSEL takes the form of $$\Gamma_a = \xi \frac{d_a}{L_{\textit{eff}}},$$

where $d_a$ and $L_{\textit{eff}}$ are the active layer thickness—the total thickness of the QWs—and the effective cavity length respectively, and ξ is the standing wave factor. Thus, in terms of the equations (1), (2), the proposed structure has a much smaller standing wave factor ξ, and thus a significantly lower $$\Gamma_a = \xi \frac{d_a}{L_{\textit{eff}}},$$

despite having a slightly (by a factor of ≈4/3) increased $d_a$ compared to the traditional structure. The configurations in FIG. 1 correspond to ξ=1.8 in the standard construction and ξ=0.2 in the modified one, which in turn corresponds to the ratios $d_a/\Gamma_a$ of ≈0.67 μm in the traditional structure and ξ6 μm in the proposed one, assuming a QW thickness of 8 nm and the effective cavity length of $L_{\textit{eff}}$≈1.2 μm. In addition to the parameter values mentioned above, we used the spontaneous emission factor $\beta_{sp}=10^{-5}$ and the gain compression coefficient $3\times10^{-17}$ cm$^{-3}$. The background internal loss (averaged over the whole effective length $L_{\textit{eff}}$ of the resonator) was $\alpha_{in0}=10$ cm$^{-1}$, and the values of top and bottom DBR reflectance coefficients (calculated without taking into account losses in the reflectors, which are instead included in $\alpha_{in0}$) were $R_{top}=0.998$ and $R_{bot}=1$. Then, the threshold condition is defined in the usual way by the relation $$\Gamma_a g_{th} = \frac{1}{2L_{\textit{eff}}} \ln \frac{1}{R_{top}R_{bot}} + \alpha_{in0} \equiv \frac{1}{v_g \tau_p},$$

where g is the material gain in the active area, and $\tau_p$ is the photon lifetime in the laser cavity, determined by the total cavity loss. The temporal profile of the pumping current pulse in our simulations was described by one period (0<t<T) of the raised-cosine dependence $$i(t)=(i\max/2)\times[1-\cos(\pi t/T_p)] \quad (3)$$

with $T_p=1.5$ ns being the pumping pulse duration.

Figure 2:
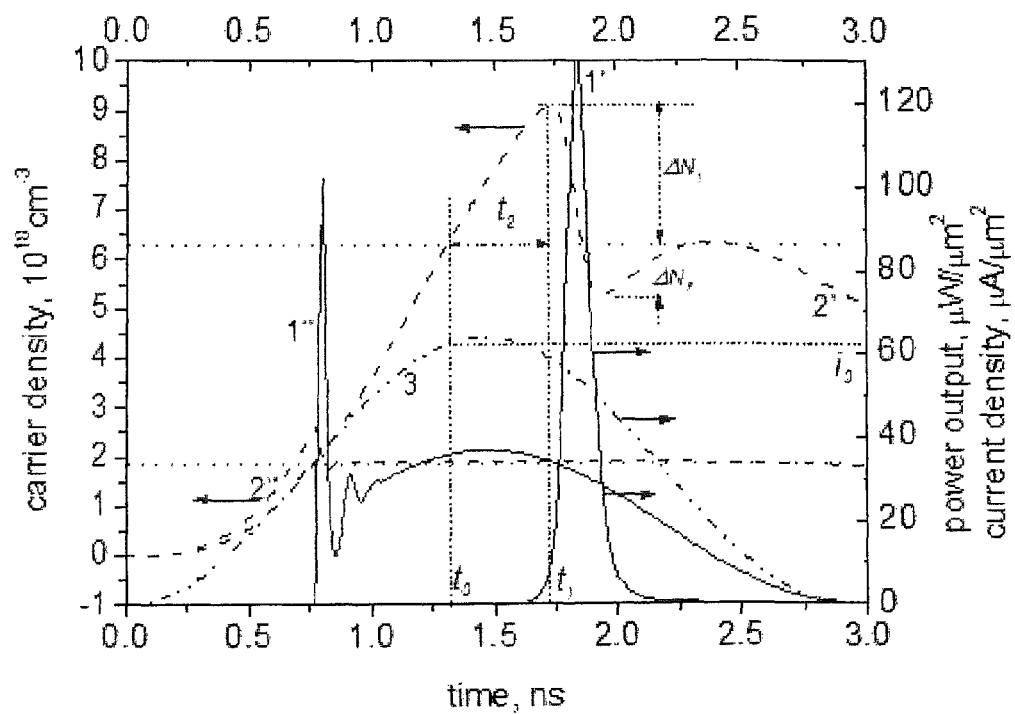
FIG. 2 illustrates an example of time dependence of the light intensity (1',1''), carrier density (2',2'') and pumping current density (3); and the standing wave factor is $\xi=0.2$ (1',2') and $\xi=1.8$ (1'',2''); the characteristic times and carrier density intervals are indicated shown for the case of $\xi=0.2$.

Shown in FIG. 2, there are examples of simulated dynamics of both the output light intensity (proportional to the photon density, curves 1', 1") and carrier density (curves 2',2") for the traditional structure with ξ=1.8 and the proposed structure with ξ=0.2, when pumped by the same current pulse (the profile of the pulse, with the peak density of ≈6.4×10$^3$ A/cm$^2$, is also shown in the figure for reference as curve 3).

It is seen that the light output in both cases starts with a sharp optical pulse. However, in the detuned structure, this pulse has a high energy, leaving the carrier density after the pulse depleted so effectively that it is not capable of recovering back to the threshold value, particularly as the pulse in this case occurs towards the trailing edge of the pumping pulse. Thus, the optical pulse remains single.

In the standard construction of the prior art, on the other hand, the initial pulse is weak (and also occurs near the leading edge of the pumping pulse), so the carrier density, depleted by the initial pulse, is nevertheless able to recover past the threshold value, and the usual sequence of decaying relaxation oscillations takes place, followed by a long trail reproducing the shape of the current pulse. In other words, the same current peak corresponds in the case of a large ξ to a standard relaxation transient followed by quasi-stationary output, and in the case of a small ξ, to a proper gain switched operation.

Figure 3:
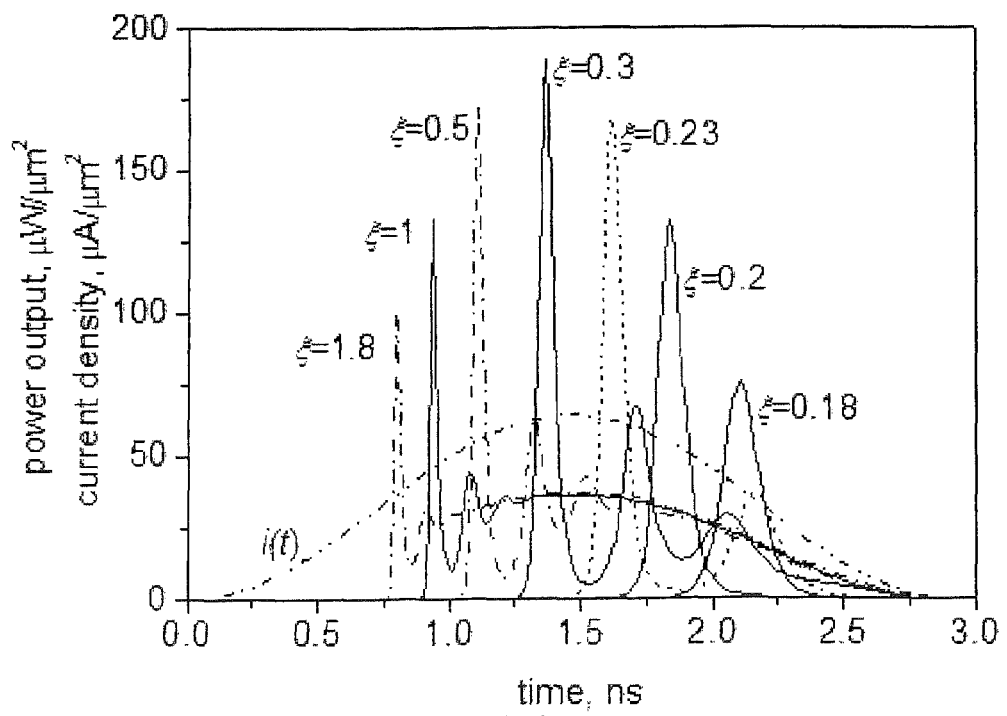
FIG. 3 illustrates examples of temporal profiles of current input and of power output for different values of standing wave factor $\xi$.

FIG. 3 illustrates an example of the evolution of the VCSEL dynamics with a variation in ξ in more detail by showing the profiles of the output light intensity of lasers with different values of ξ (and thus $d_a/\Gamma_a$), when pumped by a current density pulse (also shown for reference) of a fixed amplitude and duration. For the traditional structure with ξ=1.8, the initial optical pulse at the leading edge of the pumping pulse is followed by a long quasi-stationary trail reproducing the form of the current pulse, which contains most of the output light energy; this is the same as the curve 1' in FIG. 2. As the value of ξ (or $\Gamma_a$) decreases, ($d_a/\Gamma_a$ increases), the onset of lasing shifts towards the trailing edge of the pumping pulse, the fraction of the output energy in initial short pulse increases, and the quasi-stationary trail gradually disappears leaving only a series of decaying relaxation oscillations. Eventually, for ξ≈0.2, the output consists of a single output pulse—this is the curve 1" in FIG. 2. Any further decrease in results, in this example, in a decrease in the peak light intensity of the single output pulse and in its broadening in time, mainly because the optical pulse emission shifts towards the end of trailing edge of the current pulse as discussed in more detail below. Thus for the laser and pumping pulse parameters considered, the proposed example construction of FIG. 1, with ξ≈0.2, provides the optimal single pulse energy.

Figure 4:
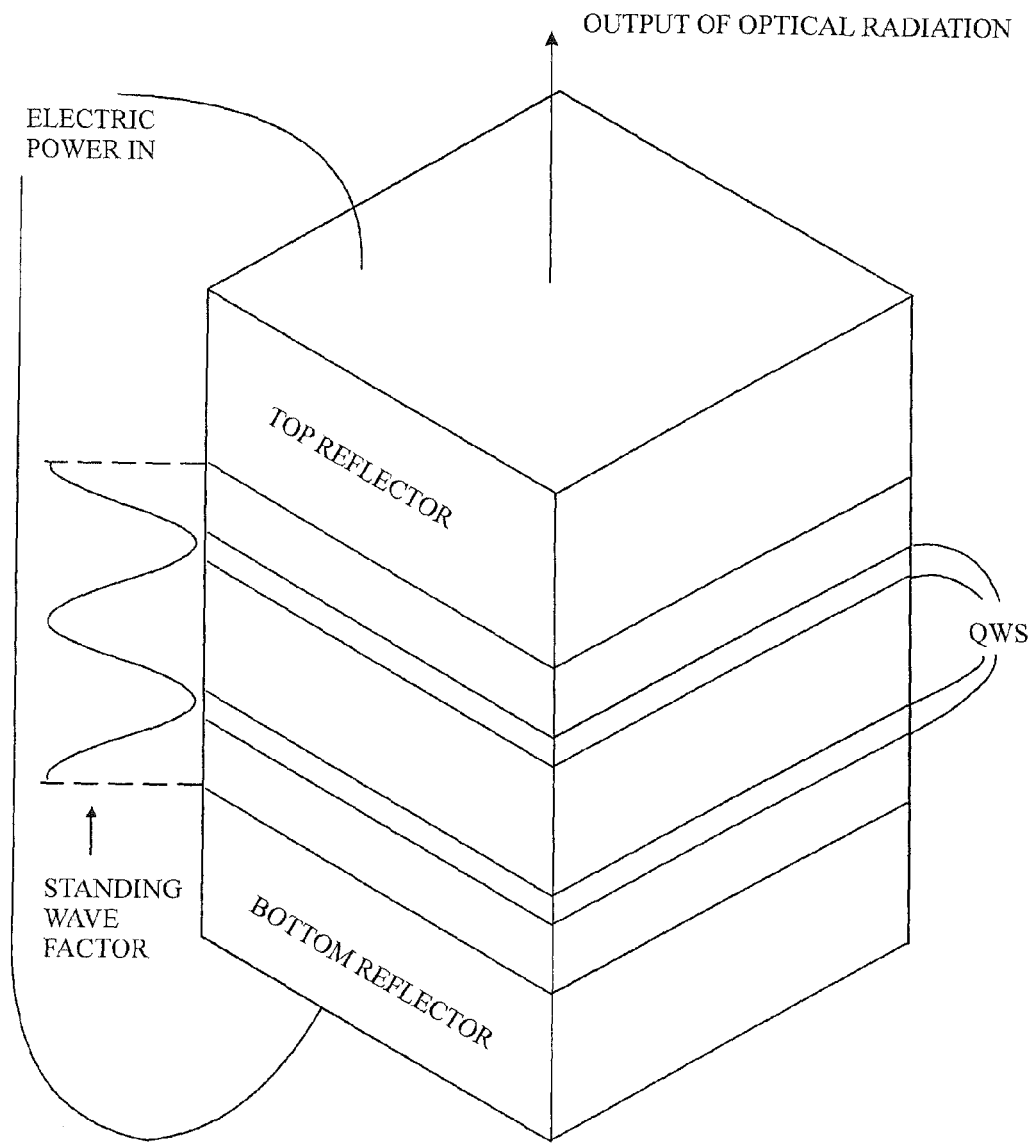
FIG. 4 illustrates an example of a layered structure of the VCSEL laser.

FIG. 4 presents an example of the layered structure of the laser. Both sides of the cavity with the quantum wells there are the reflectors through one of which the optical radiation is output. The distributed Bragg reflectors comprise a stack of layers having regularly alternating reflection indices, the thickness of each layer in the Bragg reflector depending on its reflective index. FIG. 4 also shows the standing wave factor which resembles the actual standing wave in the cavity with respect to layered positions of quantum wells near the nodes of lower value than one.

It will be obvious to a person skilled in the art that, as technology advances, the inventive concept can be implemented in various ways. The invention and its embodiments are not limited to the examples described above but may vary within the scope of the claims.

What is claimed is:

1. A vertical cavity surface emitting laser (VCSEL) configured to operate in a gain switching regime, having a cavity that is terminated by reflectors at both ends for enabling a standing wave of optical radiation therebetween;
   the cavity comprises at least one quantum well, each of which is located at a position where a value of a standing wave factor ξ for each quantum well is between zero and one, 0<ξ<1.

2. The laser of claim 1, wherein at least one of the reflectors at the ends of the cavity is a distributed Bragg reflector.

3. A pulse vertical cavity surface emitting laser (VCSEL) operating in the gain switching regime, the VCSEL comprising a cavity terminated by top and bottom distributed Bragg reflectors, and active layers inside the cavity consisting of some quantum wells whose positions in the cavity are detuned from the standing wave antinodes in such a way that the standing wave factor $\xi$ for each quantum well is between zero and one, $0<\xi<1$.

* * * * *